United States Patent
Yamauchi et al.

(10) Patent No.: US 12,002,676 B2
(45) Date of Patent: *Jun. 4, 2024

(54) METHOD FOR FORMING MASK PATTERN, STORAGE MEDIUM, AND APPARATUS FOR PROCESSING SUBSTRATE

(71) Applicant: TOKYO ELECTRON LIMITED, Tokyo (JP)

(72) Inventors: Takashi Yamauchi, Kumamoto (JP); Shinichiro Kawakami, Kumamoto (JP); Masashi Enomoto, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/969,878

(22) Filed: Oct. 20, 2022

(65) Prior Publication Data

US 2023/0042982 A1  Feb. 9, 2023

Related U.S. Application Data

(63) Continuation of application No. 16/759,532, filed as application No. PCT/JP2018/039225 on Oct. 22, 2018, now Pat. No. 11,508,580.

(30) Foreign Application Priority Data

Oct. 27, 2017  (JP) .................................. 2017-208558

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0276* (2013.01); *H01L 21/0332* (2013.01); (Continued)

(58) Field of Classification Search
CPC ............. H01L 21/0337; H01L 21/0276; H01L 21/0332; H01L 21/0335; H01L 21/31144; (Continued)

(56) References Cited

U.S. PATENT DOCUMENTS 11,508,580 B2 * 11/2022 Yamauchi ........... H01L 21/0276
2008/0199806 A1   8/2008 Hatakeyama et al.

FOREIGN PATENT DOCUMENTS

CN  104698746 A   6/2015
JP  2006-309202 A  11/2006
(Continued)

OTHER PUBLICATIONS

Tanaka, JP-2017147328, English Machine Translation, Aug. 24, 2017 (Year: 2017).
(Continued)

*Primary Examiner* — Caleen O Sullivan
(74) *Attorney, Agent, or Firm* — Nath, Goldberg & Meyer; Jerald L. Meyer; Tanya E. Harkins

(57) ABSTRACT

A technique for suppressing a metal component from remaining at a bottom of a mask pattern when the mask pattern is formed using a metal-containing resist film. A developable anti reflection film 103 is previously formed below a resist film 104. Further, after exposing and developing the wafer W, TMAH is supplied to the wafer W to remove a surface of the anti-reflection film 103 facing a bottom of the recess pattern 110 of the resist film 104. Therefore, the metal component 105 can be suppressed from remaining at the bottom of the recess pattern 110. Therefore, when the $SiO_2$ film 102 is subsequently etched using the (Continued)

pattern of the resist film 104, the etching is not hindered, so that defects such as bridges can be suppressed.

19 Claims, 15 Drawing Sheets

(51) Int. Cl.
*H01L 21/311* (2006.01)
*H01L 21/67* (2006.01)

(52) U.S. Cl.
CPC .... *H01L 21/0335* (2013.01); *H01L 21/31144* (2013.01); *H01L 21/6715* (2013.01)

(58) Field of Classification Search
CPC .......... H01L 21/6715; H01L 21/02057; H01L 21/67178; H01L 21/0273; H01L 21/31133; H01L 21/31138; H01L 21/31116; H01L 21/67115; G03F 7/26; G03F 7/20

USPC ..................................................... 430/5, 311
See application file for complete search history.

(56) References Cited

FOREIGN PATENT DOCUMENTS

| | | | |
|---|---|---|---|
| JP | 2009-063989 | A | 3/2009 |
| JP | 2014-119658 | A | 6/2014 |
| JP | 2016-29498 | A | 3/2016 |
| JP | 2017-147328 | A | 8/2017 |

OTHER PUBLICATIONS

Kizaki, JP2002190445, English Machine Translation, Jul. 5, 2002 (Year: 2002).

* cited by examiner

METHOD FOR FORMING MASK PATTERN, STORAGE MEDIUM, AND APPARATUS FOR PROCESSING SUBSTRATE

TECHNICAL FIELD

The present disclosure relates to a technique for forming a mask pattern on a surface of a substrate.

BACKGROUND

In a manufacturing process of a semiconductor device, extreme ultraviolet (EUV) lithography has been employed from recent demand for miniaturization of circuit patterns. In the EUV lithography, for example, an energy beam having a short wavelength such as ultraviolet rays or X-rays is used to form a narrow line-width pattern on a resist film. In order to perform patterning with higher contrast during imaging, a metal-containing resist as described in Patent Document 1 is used. However, in the metal-containing resist film, metal components contained in the metal-containing resist film may remain in the form of, for example, ions or the like, in a pattern portion from which the resist is removed after development.

For example, such metal components may react with an organic substance in the resist film to become a compound. Further, for example, when an organic film of a lower layer is etched, the compound derived from the metal components adhered to the bottom of the pattern may function as a mask, which inhibits etching of the thin film and causes defects such as bridges or the like in the circuit pattern formed on the thin film.

The metal components adhered to the bottom of such a pattern are strongly bonded to the surface of the pattern, and is thus hard to remove. Moreover, since the pattern may be damaged, it is difficult to dissolve and remove them using an acid such as a strong acid or the like. Consequently, there has been a demand for measures to suppress the adhesion of the metal components or to remove remaining metal components.

PRIOR ART DOCUMENTS

Patent Documents

Patent Document 1: Japanese laid-open publication No. 2016-29498

The present disclosure provides some embodiments of a technique for suppressing remaining metal components at a bottom of a pattern when a mask pattern is formed using a metal-containing resist film.

SUMMARY

According to the present disclosure, there is provided a method of forming a mask pattern on a surface of a substrate using a metal-containing resist, the method including: forming a sacrificial film on the surface of the substrate; applying the metal-containing resist to a surface of the sacrificial film to form a resist film; exposing the substrate; supplying a developing solution to the substrate to form a resist pattern; and removing at least a surface layer portion of the sacrificial film facing a bottom of the resist pattern to remove remaining metal components, wherein the sacrificial film is insoluble in the developing solution.

According to the present disclosure, there is provided a method of forming a mask pattern on a surface of a substrate using a metal-containing resist, the method including: applying the metal-containing resist to the surface of the substrate to form a resist film; exposing the substrate; supplying a developing solution to the substrate to form a resist pattern; cross-linking the resist film by irradiating the surface of the substrate with ultraviolet rays; and removing at least a surface layer of the sacrificial film facing a bottom of the resist pattern by heating the substrate, to remove remaining metal components, wherein the sacrificial film is insoluble in the developing solution.

According to the present disclosure, there is provided a storage medium storing a computer program for use in a substrate processing apparatus for forming a mask pattern using a metal-containing resist on a surface of a substrate, wherein the computer program is configured to have a group of steps to execute the above-described method of forming the mask pattern.

According to the present disclosure, there is provided a substrate processing apparatus, including: a sacrificial film coating module configured to form a coating film as a sacrificial film on a substrate; a resist coating module configured to apply a metal-containing resist to the substrate on which the sacrificial film is formed, to form a resist film; a development module in which the resist film formed and exposed is developed with a developing solution to form a resist pattern; and a sacrificial film removal module configured to remove at least a surface layer portion of the sacrificial film facing a bottom of the resist pattern to remove remaining metal components.

According to the present disclosure, there is provided a substrate processing apparatus, including: a resist coating module configured to apply a metal-containing resist to a substrate to form a resist film; a development module in which the resist film formed and exposed is developed with a developing solution to form a resist pattern; an ultraviolet irradiation module configured to irradiate a surface of the substrate after development with ultraviolet rays; and a heating module configured to heat the substrate after irradiation with the ultraviolet rays.

According to the present disclosure, when a mask pattern is formed by exposing and developing a metal-containing resist film, a sacrificial film is formed in advance under the resist film and a substrate is exposed and developed, and then at least a surface layer portion of the sacrificial film facing the bottom of the pattern is removed. Thus, it is possible to suppress remaining metal components at the bottom of the pattern.

Further, according to the present disclosure, after the metal-containing resist film is exposed and developed, at least the surface layer of the sacrificial film is shaved to put the metal components into an excited state by irradiating the substrate with ultraviolet rays, and the substrate is heated to remove the metal components. Thus, similarly, it is possible to suppress metal components remaining at the bottom of the pattern.

DETAILED DESCRIPTION

First Embodiment

Figure 1:
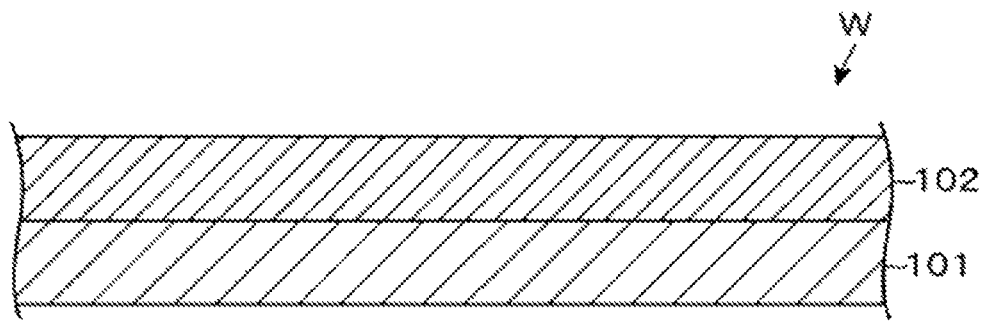
FIG. 1 is a cross-sectional view illustrating a wafer before a mask pattern is formed.
Figure 2:
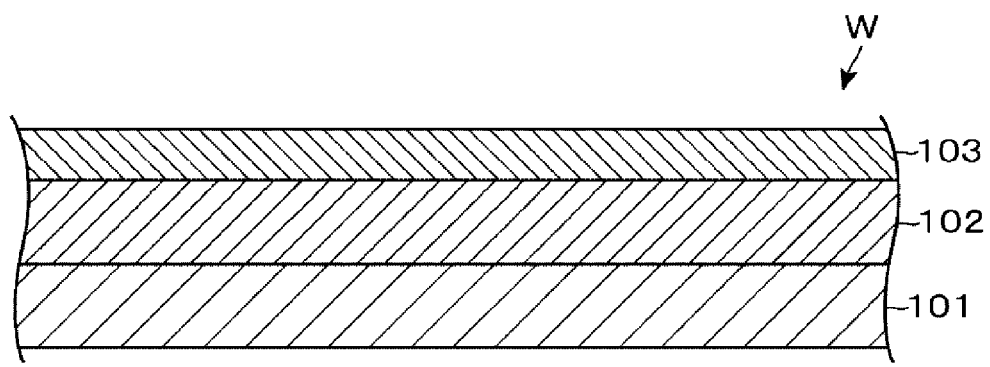
FIG. 2 is an explanatory view illustrating a mask pattern forming process.
Figure 3:
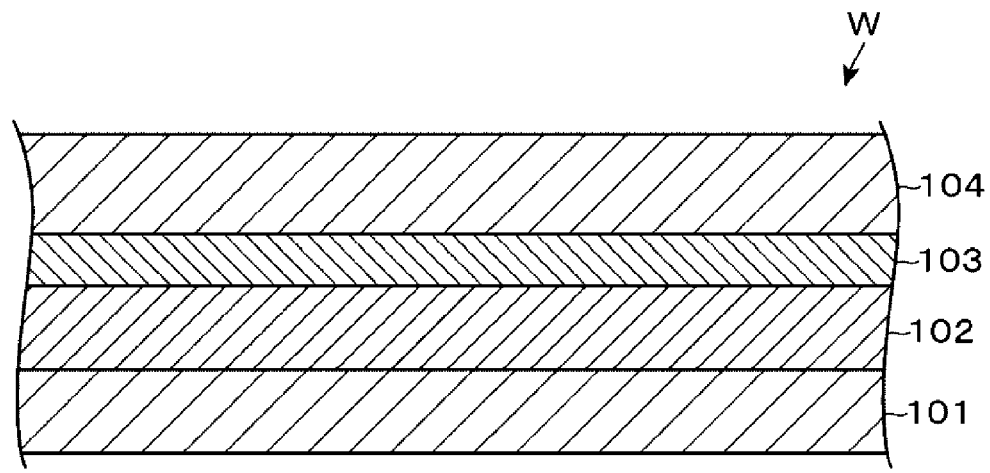
FIG. 3 is an explanatory view illustrating a mask pattern forming process.

A first embodiment of the present disclosure will be described. As illustrated in FIG. 1, in a semiconductor wafer (hereinafter, referred to as a "wafer") W, which is a semiconductor substrate before application of a resist film, a silicon oxide ($SiO_2$) film 102 is formed on a silicon substrate 101 as an example in which a circuit pattern is formed according to, for example, a resist mask pattern. Next, a sacrificial film is formed on the wafer W as illustrated in FIG. 2. As the sacrificial film, for example, an anti-reflection film 103, which is insoluble in a developing solution for developing a resist film and is soluble in tetramethylammonium hydroxide (TMAH), and whose exposed portion is insoluble in TMAH, may be used. Thereafter, as illustrated in FIG. 3, a negative type resist film (metal-containing resist film) 104 containing metal in this example is formed over the anti-reflection film 103 of the wafer W. Next, the wafer W is transferred to an exposure device using EUV to expose the pattern.

At this time, an exposed region of the resist film 104 becomes insoluble in the developing solution, for example, 2-heptanone. Also, the anti-reflection film 103 under the exposed region is exposed to become insoluble in TMAH.

Figure 4:
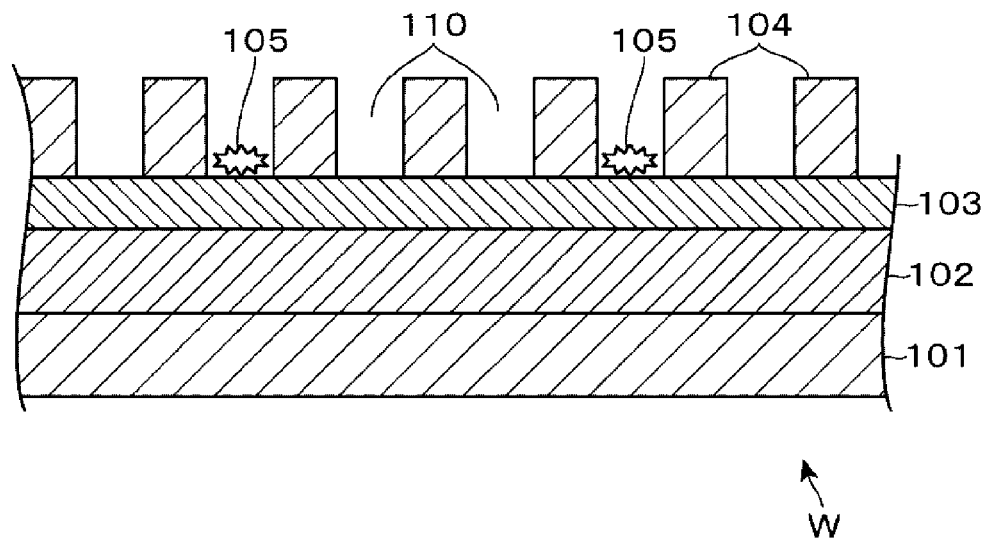
FIG. 4 is an explanatory view illustrating a mask pattern forming process.

Furthermore, when the wafer W is transferred to a development module, the developing solution, for example, 2-heptanone, is supplied to its surface to perform negative tone development. Accordingly, as illustrated in FIG. 4, unexposed regions of the resist film 104 are removed by being dissolved in the developing solution, and the anti-reflection film 103 under the resist film 104 faces the bottom of a recess pattern 110 formed by the development. At this time, metal components 105 contained in the removed resist film 104 may be adhered to and remain on the surface of the anti-reflection film 103 at the bottom of the recess pattern 110.

Figure 5:
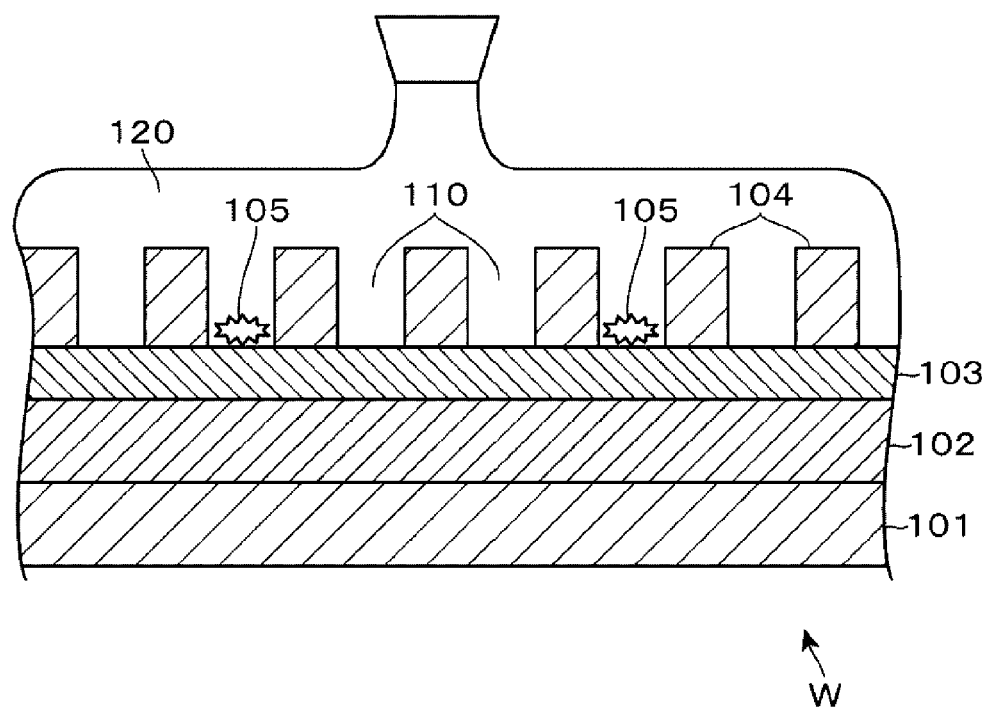
FIG. 5 is an explanatory view illustrating a mask pattern forming process.

Subsequently, as illustrated in FIG. 5, for example, TMAH 120 is supplied to the wafer W. At this time, the supplied TMAH 120 enters the recess pattern 110 and is brought into contact with the anti-reflection film 103 exposed at the bottom of the recess pattern 110. Since the surface of the anti-reflection film 103 facing the bottom of the recess pattern 110 is not exposed, it is soluble in the TMAH 120 to be dissolved and removed, leaving an exposed region.

Figure 6:
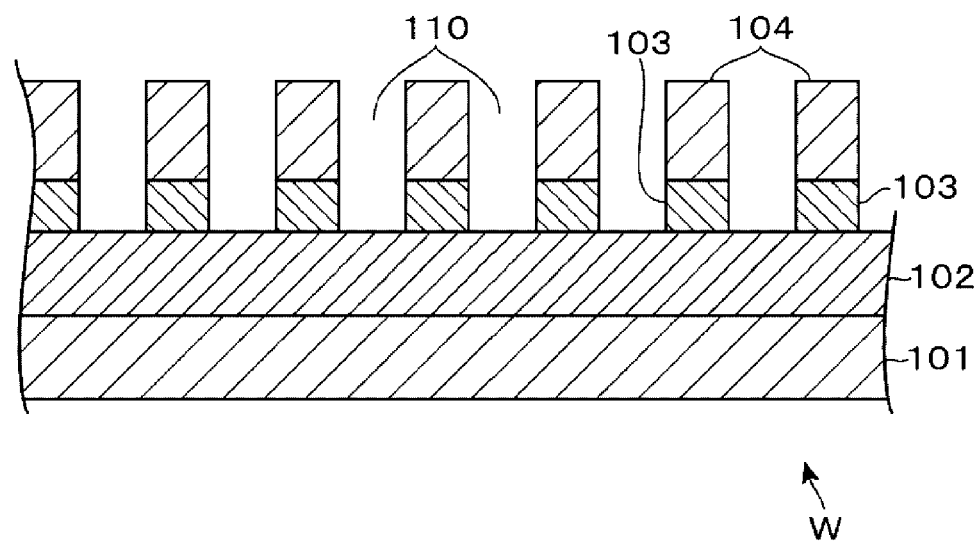
FIG. 6 is an explanatory view illustrating a mask pattern forming process.

Accordingly, as illustrated in FIG. 6, the anti-reflection film 103 to which the metal components 105 are adhered is dissolved and removed, and thus, the $SiO_2$ film 102 under the anti-reflection film 103 is exposed at the bottom of the recess pattern 110. The metal components 105 contained in the resist film 104 are removed together with the anti-reflection film 103 in this manner, so as to allow the recess pattern 110 to become a state in which the metal components 105 adhered to the bottom of the recess pattern 110 are removed. Furthermore, the $SiO_2$ film 102 under the anti-reflection film 103 is exposed by the TMAH 120 in this example, but only a surface layer to which the metal components are adhered may be dissolved.

Figure 7:
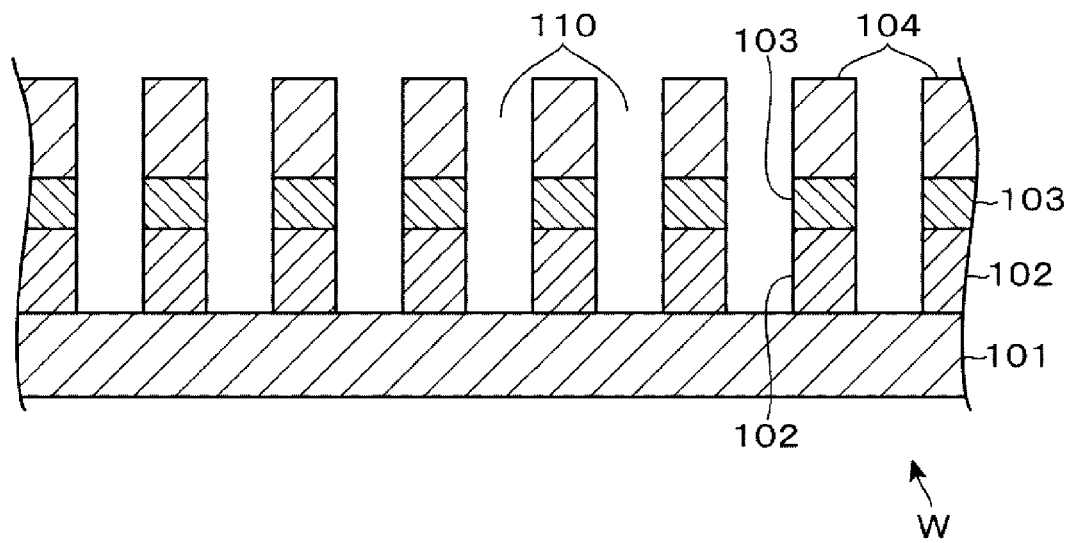
FIG. 7 is an explanatory view illustrating a mask pattern forming process.
Figure 8:
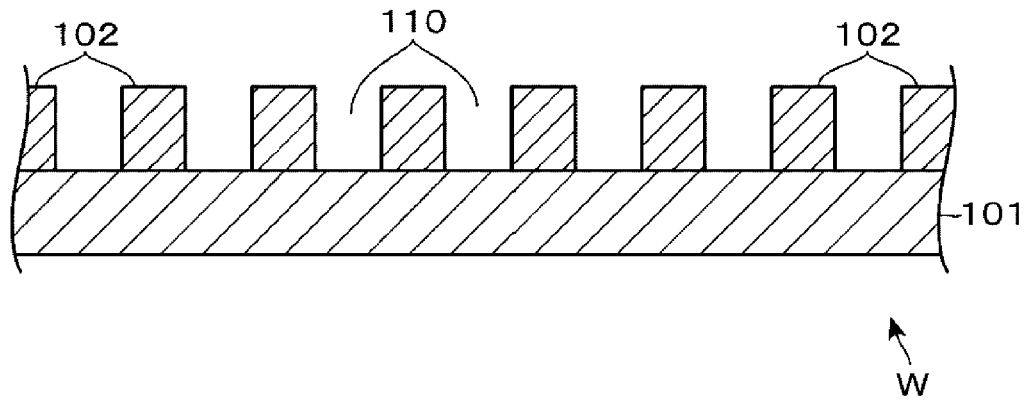
FIG. 8 is an explanatory view illustrating a mask pattern forming process.

Thereafter, the wafer W is transferred to, for example, a dry etching device using plasma, in which the $SiO_2$ film 102 is etched based on a mask pattern of the resist film 104 as illustrated in FIG. 7. Thereafter, as illustrated in FIG. 8, the mask pattern of the resist film 104 is removed by ashing using, for example, a plasma etching device, and then the anti-reflection film 103 is removed by dry etching.

As described in the Background section, when the metal components 105 remain on the surface of the underlying film on which the circuit pattern is formed, the metal components 105 may be combined with organic components in the resist film 104 to form a compound. The compound generated at this time may function as an etching mask, by which the portion on which the compound remains may not be etched when etching is performed, causing defects such as bridges or the like. Therefore, as the metal components 105 are not allowed to remain on the surface of the $SiO_2$ film 102 facing the bottom of the recess pattern 110 by removing the remaining metal components 105 together with the anti-reflection film 103, it is possible to suppress etching defects.

Next, a substrate processing apparatus which is a mask pattern forming apparatus that executes the aforementioned mask pattern forming method will be described with reference to FIGS. 9 to 11. This substrate processing apparatus is configured by connecting a carrier block B1, a processing block B2, and an interface block B3 in a straight line. An exposure station B4 is further connected to the interface block B3.

The carrier block B1 loads and unloads the wafers between a carrier C (for example, FOUP), which is a transfer container configured to store a plurality of wafers W, which are product substrates, each having a diameter of, e.g., 300 mm, and the apparatus. The carrier block B1 includes a mounting stage 91 for the carrier C, a lid 92, and a transfer arm 93 for transferring the wafers W from the carrier C via the lid 92.

The processing block B2 is configured by stacking first to sixth unit blocks D1 to D6 for performing liquid processing on the wafers W sequentially from the bottom, in which the unit blocks D1 to D6 have substantially the same configuration. In FIG. 9, alphabetic characters attached to the respective unit blocks D1 to D6 indicate process types, in which BCT is a process for forming a developable anti-reflection film, COT is a resist film forming process for forming a resist film by supplying a resist to the wafers W, and DEV indicate a development process.

Figure 11:
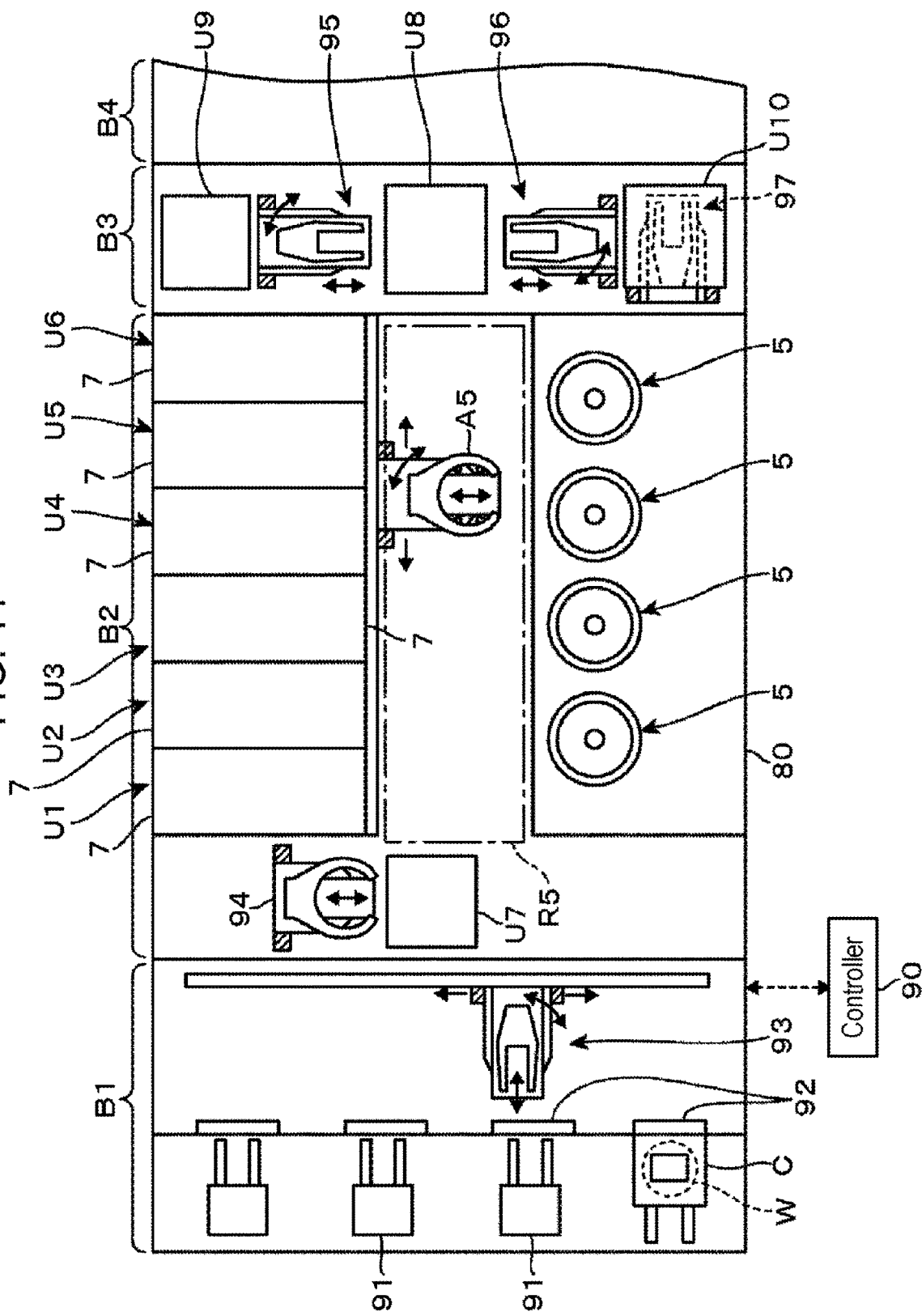
FIG. 11 is a plan view illustrating the substrate processing apparatus according to the first embodiment.

In FIG. 11, a configuration of the unit block D5 is representatively illustrated, in which the unit block D5 includes a linear transfer region R5 extending from the carrier block B1 side to the interface block B5 and a main arm A5 moving in the transfer region R5. Furthermore, development modules 5 as liquid processing modules are installed on the right side of the transfer region R5 as viewed from the carrier block B1 side. In addition, shelf units U1 to U6 in which heating and cooling modules 7 including a heating plate as a mounting part for heating the wafer W and a cooling plate for cooling the wafer W are stacked are installed on the left side of the transfer region R5.

A shelf unit U7 configured by a plurality of modules stacked on each other is installed on the carrier block B1 side of the transfer region R5. The transfer of the wafer W between the transfer arm 93 and a main arm A3 is performed via a transfer module TRS of the shelf unit U7 and the transfer arm 94. The transfer module TRS includes a transfer stage as a mounting part for transferring the wafer W.

The interface block B3 is for transferring the wafer W between the processing block B2 and the exposure station B4, and includes shelf units U8, U9, and U10 in which a plurality of processing modules are stacked on each other. In the drawing, reference numerals 95 and 96 denote transfer arms for transferring the wafer W between the shelf units U8 and U9 and between the shelf units U9 and U10, respectively. Furthermore, in the drawing, reference numeral 97 denotes a transfer arm for transferring the wafer W between the shelf unit U10 and the exposure station B4. Main arms A1 to A6 and the transfer arms 93 to 97 correspond to a substrate transfer mechanism.

A specific example of each of the modules installed in the shelf units U7, U8, U9, and U10 is configured as the aforementioned transfer module TRS or the like used when transferring the wafer W into and out of the unit blocks D1 to D6.

Figure 12:
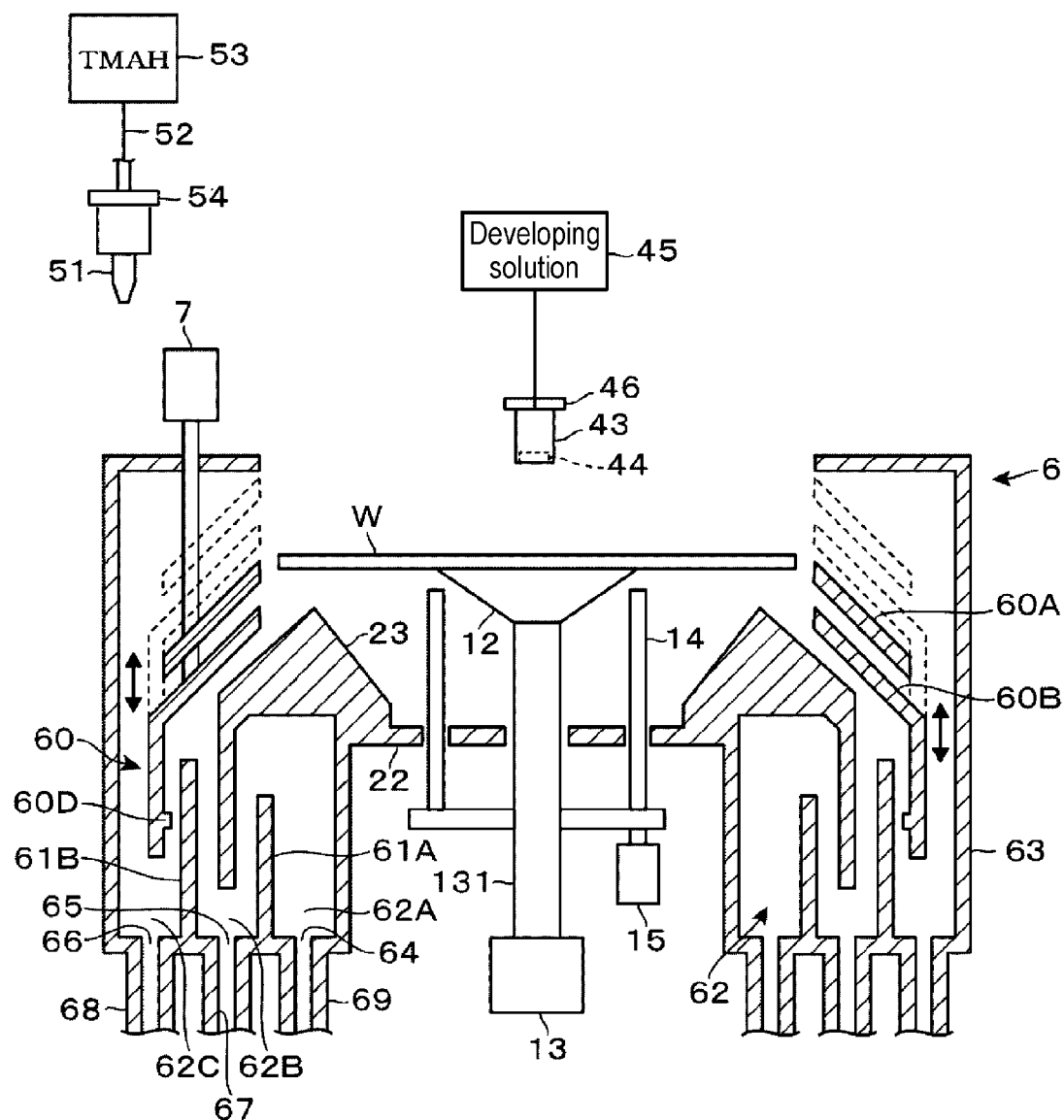
FIG. 12 is a longitudinal sectional view illustrating a development module.

Next, the development module 5 will be described. As illustrated in FIG. 12, the development module 5 includes a cup body 6, a developer nozzle 43, and a chemical nozzle 51 for supplying a chemical solution for removing the anti-reflection film. In the development module 5, the cup body 6 is configured to discharge an aqueous waste liquid and a waste liquid of an organic solvent such as a developing solution to the outside of the cup body 6 so as not to be mixed with each other, for example, according to a request of a factory in which the development device is installed.

Furthermore, the development module 5 includes a spin chuck 12 connected to a rotary mechanism 13 via a rotary shaft 131 and configured to be rotatable around a vertical axis. In addition, reference numeral 14 in FIG. 12 is an elevating pin for elevating and lowering the wafer W and transferring the wafer W into and out of the external main arm A5, and reference numeral 15 in FIG. 12 denotes an elevating mechanism.

The cup body 6 includes a movable cup 60 for forming two separate liquid discharge passages. The movable cup 60 is installed so as to surround the periphery of the wafer W held on the spin chuck 12, a circular plate 22, and a chevron guide part 23. The movable cup 60 is configured by vertically overlapping circular ring plates 60A and 60B inclined from the center side of the cup body 6 toward the peripheral edge at an interval. The lower ring plate 60B is bent on the way down, in which its lower end portion is defined as a cylindrical part 60C formed so as to extend in the vertical direction. In addition, a projection 60D protruding inward is formed over the whole circumference at a position below the inner surface of the cylindrical part 60C. Furthermore, reference numeral 7 in FIG. 12 denotes an elevating mechanism which moves the movable cup 60 up and down between a rising position and a lowering position.

The cup body 6 includes a cylindrical outer cup 63 so as to surround the further outer side of the movable cup 60. An upper end of the outer cup 63 is horizontally bent toward the center side, and a lower end of the outer cup 63 is formed with a ring-shaped liquid storage part 62 having a recess cross section. Partition walls 61A and 61B, which are respectively erected, are formed in the liquid storage part 62 to be concentric in plan view sequentially toward the peripheral edge of the outer cup 63. In addition, three annular recesses 62A, 62B, and 62C are formed by the partition walls 61A, 61B and the sidewall of the outer cup 63 to be concentric in plan view sequentially toward the peripheral edge of the outer cup 63. Furthermore, an exhaust port 64, a liquid discharge port 65, and a liquid discharge port 66 are respectively opened on the bottom surfaces of the recesses 62A, 62B, and 62C. The liquid discharge port 65 is connected to a liquid discharge pipe 67 for discharging an organic processing liquid, and the liquid discharge port 66 is connected to a liquid discharge pipe 68 for discharging a liquid containing no organic solvent such as pure water or the like. In addition, reference numeral 69 in FIG. 12 denotes an exhaust pipe.

When the organic processing liquid, for example, 2-heptanone, which is a developing solution, is centrifuged from the wafer W, the movable cup 60 is raised to a rising position. Therefore, the processing liquid centrifuged from the wafer W is received by the movable cup 60, flows into the recess 62B, and is discharged from the liquid discharge port 65. When a liquid containing no organic processing liquid, for example, TMAH as a chemical liquid, is centrifuged from the wafer W, the movable cup 60 is lowered to a lowering position. Therefore, the processing liquid centrifuged from the wafer W is received by the outer cup 63 beyond the movable cup 60, flows into the recess portion 62, and is discharged from the liquid discharge port 66.

In the drawing, reference numeral 43 denotes a developer nozzle, which discharges the developing solution vertically downward from a discharge port 44 formed in a slit shape. In the drawing, reference numeral 45 denotes a developer supply source 45, which supplies the stored developing solution to the developer nozzle 43. In the drawing, reference numeral 46 denotes an arm for supporting the developer nozzle 43 at its leading end, which is configured to move between the inside and the outside of the cup body 6 by a driving mechanism (not shown).

In the drawing, reference numeral 51 denotes a chemical liquid nozzle for supplying TMAH which is the chemical liquid for removing the anti-reflection film. In the drawing, reference numeral 53 denotes a supply source of TMAH, which supplies the stored TMAH to the chemical liquid nozzle 51 via a chemical liquid supply path 52. In the drawing, reference numeral 54 denotes an arm for supporting the chemical liquid nozzle 51 at its leading end, which is configured to move between the inside and the outside of the cup body 6 by a driving mechanism (not shown). In this example, the development module 5 also serves as a sacrificial film removal module. Furthermore, the developing solution of the present disclosure may be a mist.

The other unit blocks D1 to D4 have substantially the same configuration as the unit block D5 except that the liquid processing module is different. Instead of the development module 5, an anti-reflection film coating module for applying the developable anti-reflection film 103 to the wafer W is installed in the unit blocks D1 and D2, and instead of the development module 5, a resist coating module for applying the resist film 104 to the wafer W is installed in the unit blocks D3 and D4.

As the anti-reflection film coating module, for example, a known coating processing device may be used. The anti-reflection film coating module does not have the movable cup 60 so as to surround the periphery of the spin chuck which rotates the wafer around the vertical axis, and includes a cup body having substantially the same configuration as the development module except that the liquid discharge port is only the liquid discharge port for discharging a coating liquid. Furthermore, the anti-reflection coating module includes an anti-reflection film nozzle for supplying a material for the developable anti-reflection film, instead of the developer nozzle and the chemical liquid nozzle. It is configured such that the coating liquid serving as the anti-reflection film can be supplied to the wafer W held by the spin chuck and rotating around the vertical axis.

Furthermore, the resist coating module has substantially the same configuration as the anti-reflection film coating module except that the coating liquid supplied to the wafer W is a metal-containing resist liquid. It is also configured such that the metal-containing resist liquid can be supplied to the wafer W held by the spin chuck and rotating around the vertical axis. The heating and cooling module 7 heats the wafer W mounted on the stage by a heater embedded in the stage, and may be configured to include a cooling mechanism for cooling the wafer W in the transfer arm for transferring the wafer W to the stage.

In addition, a controller 90 configured as, for example, a computer, is installed in the substrate processing apparatus. The controller 90 has a program storage part. The program storage part stores a program in which a group of steps are prepared to execute a step of transferring the wafer W in the substrate processing apparatus or a step of processing the wafer W in each module so as to perform the mask pattern forming method already described above. This program is stored in, for example, a storage medium such as a flexible disk, a compact disc, a hard disk, a magneto-optical disc (MO), a memory card or the like, and is installed in the controller 90.

In this substrate processing apparatus, when the carrier C illustrated in FIG. 1 in which the wafer W is stored is held on the mounting stage 91, the wafer W is taken out by the transfer arm 93 and transferred to the unit block D1 or D2. Next, in the unit block D1 or D2, the developable anti-reflection film 103 is formed on the wafer W and then the wafer W is transferred to the unit block D3 or D4 to form the resist film 104 thereon. Thereafter, the wafer W is transferred to the exposure station, in which the exposure process is performed by EUV and then transferred to the unit block D5 or D6. Then, in the unit block D5 or D6, the wafer is loaded into the development module 5, in which the development of the resist film 104 and the removal of the anti-reflection film 103 are performed and the wafer is returned to the carrier C. The wafer W returned to the carrier C is sequentially transferred to, for example, an external dry etching device and a plasma etching device, in which the $SiO_2$ film 102 is etched and the metal-containing resist film 104 and the anti-reflection film 103 are removed as described above.

According to the aforementioned embodiment, in forming a mask pattern by exposing and developing the resist film 104, the developable anti-reflection film 103 is formed in advance under the resist film 104. Furthermore, after the wafer W is exposed and developed, TMAH is supplied to the wafer W to remove the surface of the anti-reflection film 103 facing the bottom of the recess pattern 110 of the resist film 104. Thus, it is possible to suppress the metal components 105 remaining at the bottom of the recess pattern 110. Therefore, when the $SiO_2$ film 102 is subsequently etched using the pattern of the resist film 104, since the etching is not hindered by the compound derived from the metal components 105, it is possible to suppress defects such as bridges or the like.

In the aforementioned embodiment, there has been described an example in which the resist film 104 is a negative tone development type resist film, but the resist film 104 may be a positive tone development type resist film. In this case, the developable anti-reflection film 103 may also be a film whose exposed region can be removed with a chemical liquid, for example, TMAH. Even in this case, it is possible to achieve an effect by removing a layer to which the metal components 105 are adhered on its surface.

Next, another example of the mask pattern forming method according to the first embodiment will be described. In this example, after the resist film 104 is developed, oxygen is activated by irradiation with ultraviolet rays, the sacrificial film is shaved with the activated oxygen, and the metal components 105 remaining on the surface of the sacrificial film is removed. In this example, as the sacrificial film formed under the resist film 104, a spin on carbon (SOC) film formed of an organic film containing carbon as a main component having, for example, a carbon content of 80 to 90%, may be used. As a raw material of the SOC film, an organic film raw material containing a carbon compound decomposed by reacting with active oxygen or ozone generated by irradiation with ultraviolet rays in an oxygen-containing atmosphere, for example, a coating liquid obtained by dissolving a polymer raw material having a skeleton of a polyethylene structure $((-CH_2-)_n$ in a solvent, is used. The SOC film is not dissolved in a developing solution for developing the resist film.

Figure 9:
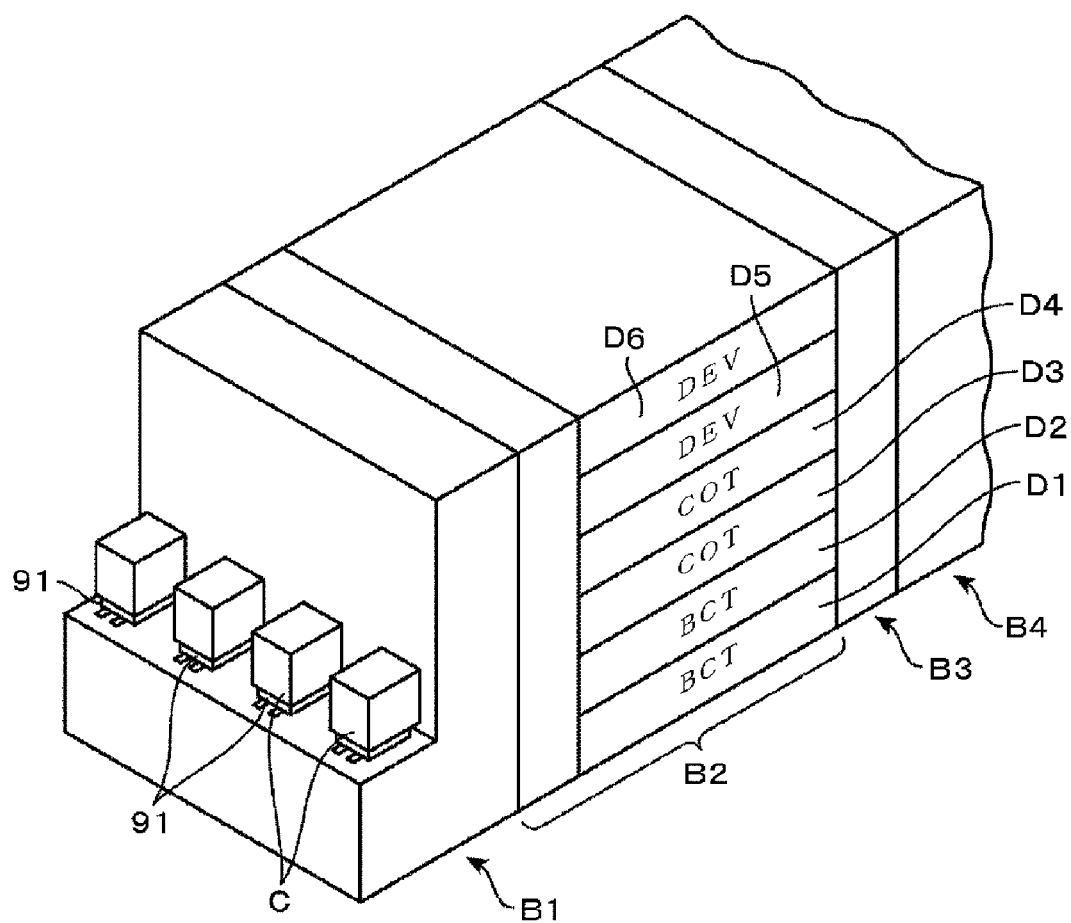
FIG. 9 is a perspective view illustrating a substrate processing apparatus according to a first embodiment of the present disclosure.
Figure 10:
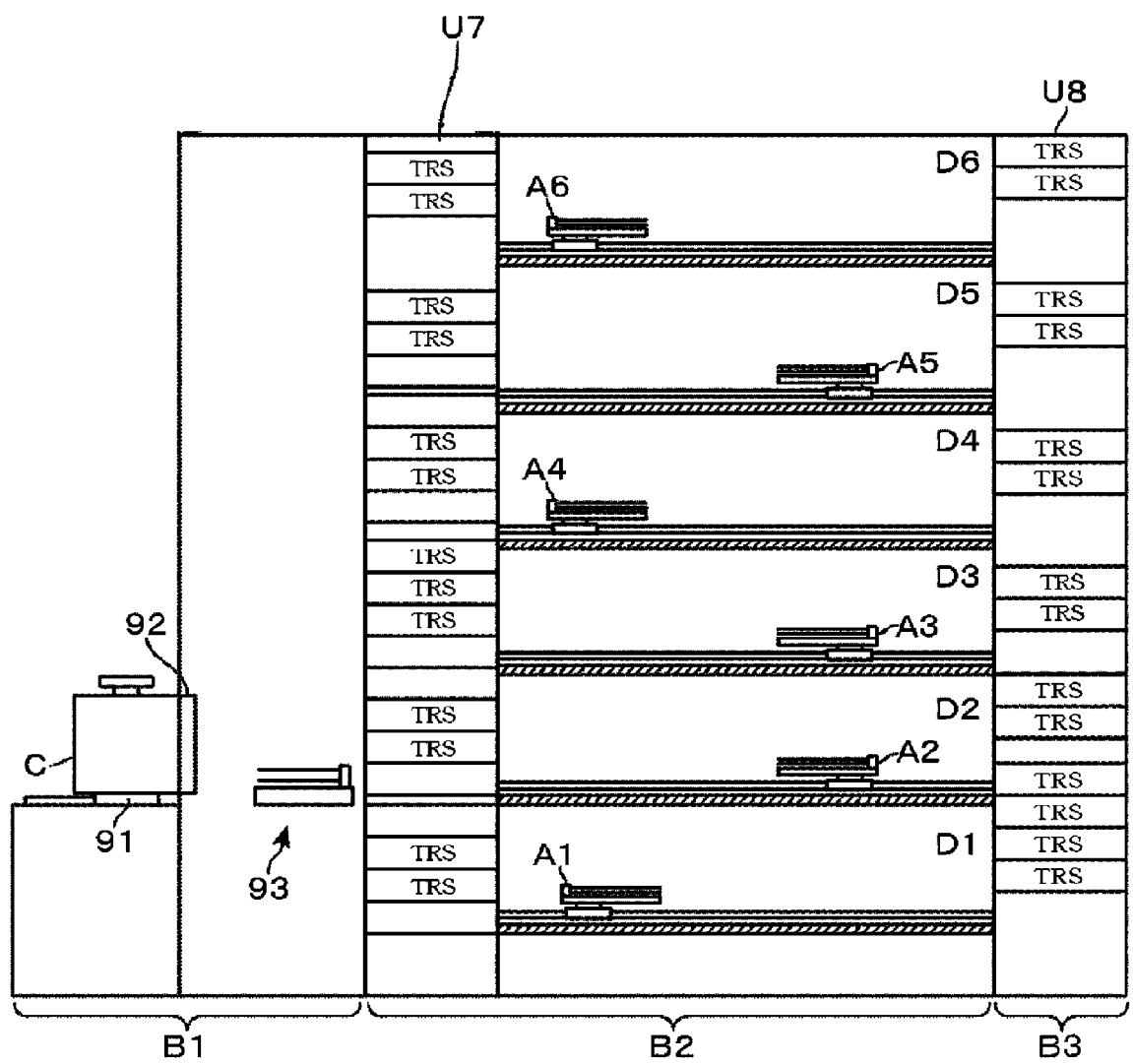
FIG. 10 is a longitudinal sectional view illustrating the substrate processing apparatus according to the first embodiment.

A substrate processing apparatus in which an SOC film coating module is installed instead of the anti-reflection film coating module, for example, in the substrate processing apparatus illustrated in FIGS. 9 to 11 is used as the substrate processing apparatus which performs such a mask pattern forming method. The SOC film coating module has substantially the same configuration as the anti-reflection film coating module except that, for example, the coating liquid supplied to the wafer W is a coating liquid containing a precursor of the SOC film such as the aforementioned polymer raw material or the like.

Figure 13:
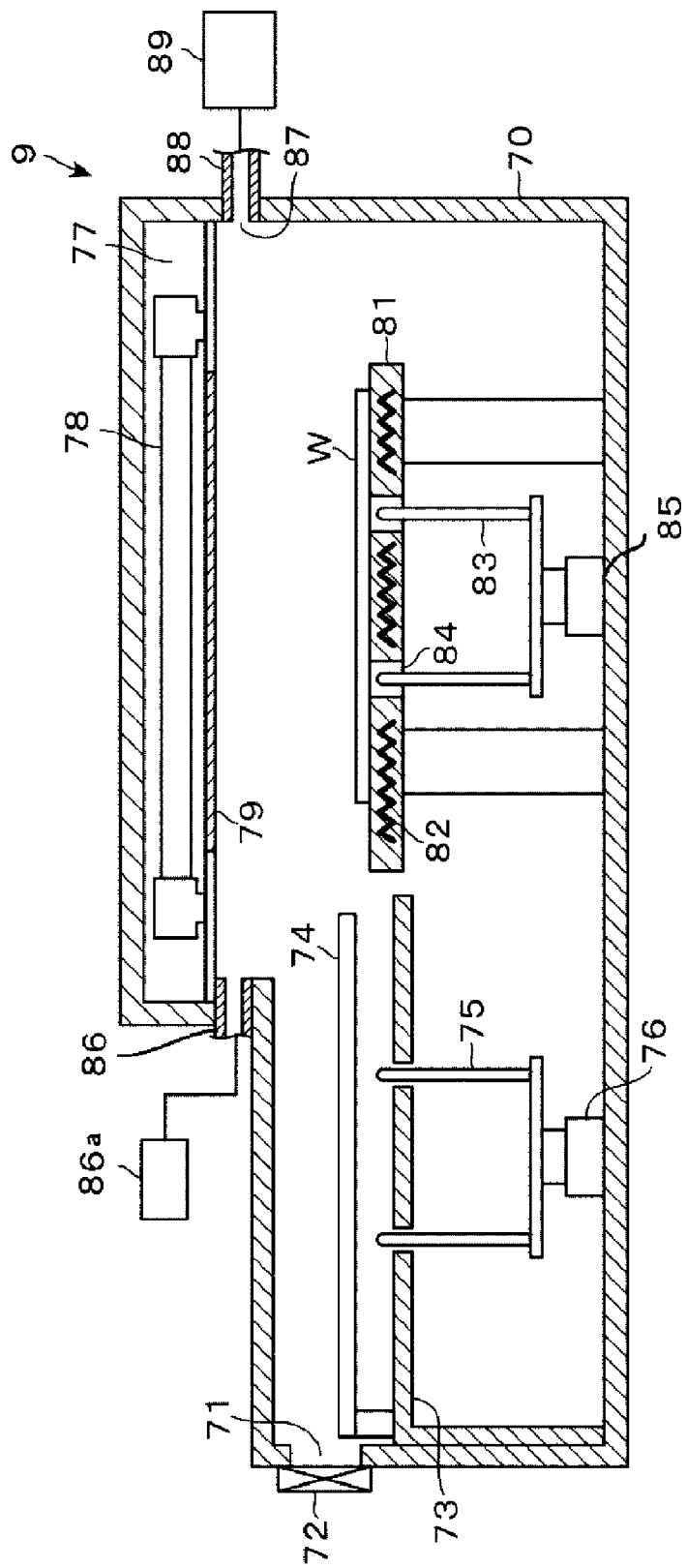
FIG. 13 is a longitudinal sectional view illustrating a UV irradiation module.

Furthermore, for example, one of the heating and cooling modules 7 in the substrate processing apparatus is configured as an ultraviolet (UV) irradiation module. FIG. 13 illustrates an example of a UV irradiation module 9. As illustrated in FIG. 13, the UV irradiation module 9 includes a flat rectangular parallelepiped housing 70 elongated in the longitudinal direction, a loading/unloading port 71 for loading and unloading the wafer W through a front sidewall surface of the housing 70, and a shutter 72 for opening and closing the loading/unloading port 71. A transfer arm 74 configured as a cooling arm for transferring the wafer W and cooling the processed wafer W is installed in a space above a partition plate 73 on the front side, as viewed from the loading/unloading port 71, in the housing 70. The transfer arm 74 has a movement mechanism (not shown) for moving in the longitudinal direction between a front position at which the wafer W is transferred into and out of an external transfer arm, for example, the main arm A5, and a rear position at which the wafer W is transferred into and out of a stage 81 as described later.

Elevating pins 75 for temporarily supporting the wafer W when the wafer W is transferred between the main arm A5 and the transfer arm 74 are installed at the front position at which the wafer W is transferred into and out of the external transfer arm. The elevating pins 75 are connected to an elevating mechanism 76 arranged in a space below the partition plate 73 so as to be elevated and lowered between a position below a mounting surface of the wafer W on the transfer arm 74 and a position above the mounting surface at which the wafer W is transferred into and out of the external transfer arm.

The stage 81 for the wafer W is arranged at a rear side of a position at which the transfer arm 74 transfers the wafer W into and out of the external main arm A5. The stage 81 has a heater 82 embedded therein, and also has a function as a heating part for heating the wafer W. Elevating pins 83 for temporarily supporting the wafer W when the wafer W is transferred into and out of the transfer arm 74 are installed below the stage 81.

The elevating pins 83 are connected to an elevating mechanism 85 so as to be elevated and lowered between a position below the mounting surface of the wafer W on the transfer arm 74 moved to over the stage 81 and a position above the mounting surface. Thus, the wafer W is transferred between the elevating pins 83 and the transfer arm 74.

A lamp chamber 77 containing a UV lamp 78 serving as a light source part for irradiating the wafer W mounted on the stage 81 with UV light is formed above the stage 81. A UV transmission part 79, which is a light transmission window for transmitting the UV light irradiated from the UV lamp 78 toward the wafer W, is installed on a lower surface of the lamp chamber 77. The UV transmission part 79 is made of, for example, a quartz plate or the like for transmitting UV light. As the UV lamp 78, for example, a lamp for irradiating UV having a peak wavelength of 172 nm may be used.

Furthermore, a gas supply part 86 for supplying clean air into the housing 70 and an exhaust port 87 for exhausting an internal atmosphere of the housing 70 are installed to face each other on a lower sidewall of the lamp chamber 77. An exhaust mechanism 89 is connected to the exhaust port 87 via an exhaust pipe 88. Reference numeral 86a in FIG. 13 denotes a clean gas supply source.

In this example, for example, the SOC film 106 is formed on the surface of the wafer W illustrated in FIG. 1, and then the resist film 104 is formed on the surface of the SOC film 106. Thereafter, the resist film 104 is exposed and developed in the same manner as in the mask pattern forming method according to the first embodiment. Therefore, the SOC film 106 is in a state facing the bottom of the recess pattern 110 formed on the resist film 104 in the same manner as in FIG. 4 except that the sacrificial film is the SOC film 106. At this time, the metal components 105 contained in the resist film 104 are adhered to the surface of the SOC film 106 facing the bottom of the recess pattern 110.

Figure 14:
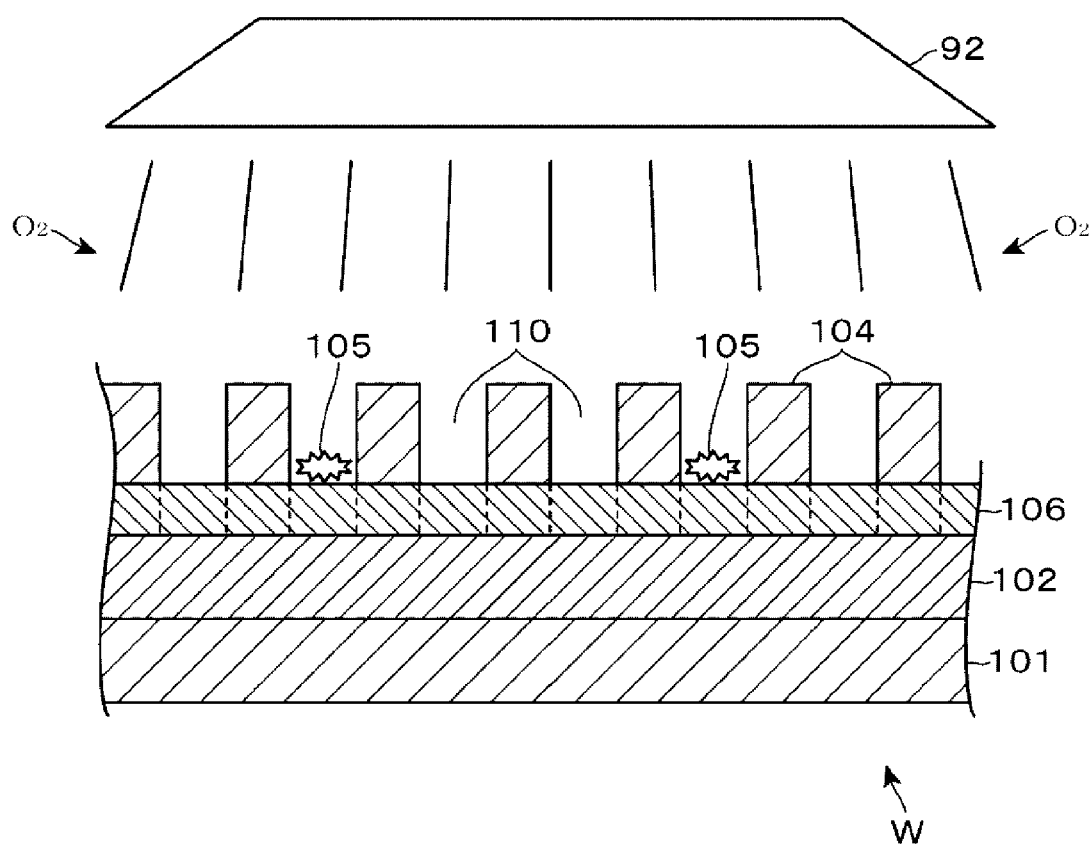
FIG. 14 is an explanatory view illustrating a mask pattern forming process according to another example of the first embodiment.
Figure 15:
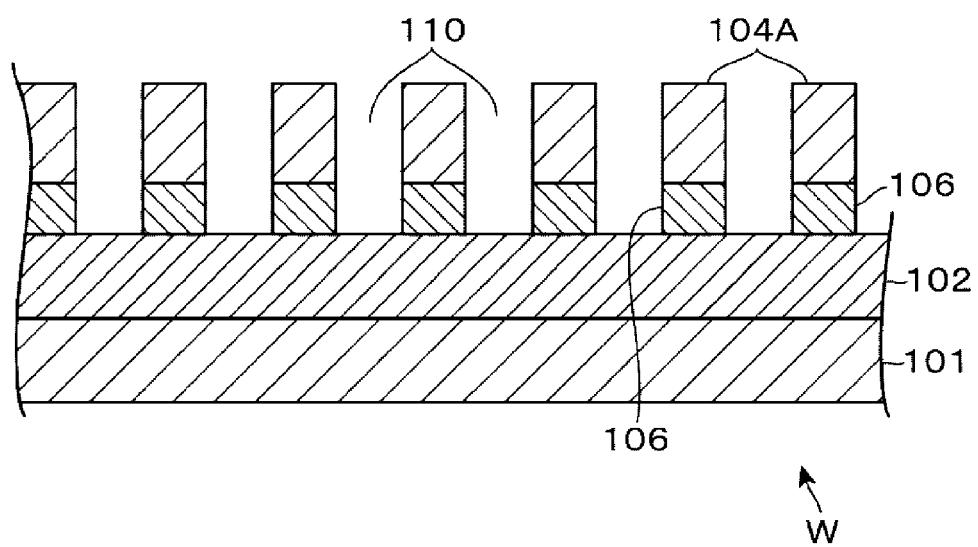
FIG. 15 is an explanatory view illustrating a mask pattern forming process according to another example of the first embodiment.

In addition, the wafer W is subsequently transferred to the UV irradiation module 9. In the UV irradiation module 9, the wafer W is mounted on the stage 81, the clean air is supplied from the gas supply part 86a, and exhaust starts from the exhaust port 87. Thereafter, as illustrated in FIG. 14, the wafer W is heated to, e.g., 250 degrees C., and the UV lamp 78 is turned on to irradiate UV light. Active oxygen and ozone are generated from oxygen in the clean air (oxygen-containing atmosphere) over the wafer W by the irradiated UV light. The surface of the SOC film 106 (portion of the SOC film) is decomposed by these active oxygen and ozone. Furthermore, the resist film 104 is cross-linked to become a resist film 104A having enhanced strength by irradiation with UV. At this time, the metal components adhered to the surface of the SOC film 106 are delaminated together with the SOC film 106, are captured by, for example, clean air flowing over the wafer W, and are exhausted from the exhaust port 87. Therefore, as illustrated in FIG. 15, the SOC film 106 at the bottom of the recess pattern 110 is removed, and the remaining metal components 105 therein are removed. Thus, as in the first embodiment, when etching is subsequently performed, defects such as bridges or the like are suppressed. In addition, since it is sufficient to generate the active oxygen to such an extent that the surface of the SOC film 106 can be shaved by the light of the UV lamp 78, the heating of the wafer W is not necessary when irradiated with UV light. However, the surface of the SOC film 106 can be more reliably shaved when heating the wafer.

In the first embodiment, the sacrificial film is removed to expose the SiO$_2$ film 102 on the lower layer side, but only a portion of the surface of the sacrificial film to which the metal components 105 are adhered may be removed. Thereafter, when etching is performed using the mask pattern, the sacrificial film remaining at the bottom of the recess pattern 110 may be removed.

Second Embodiment

Figure 16:
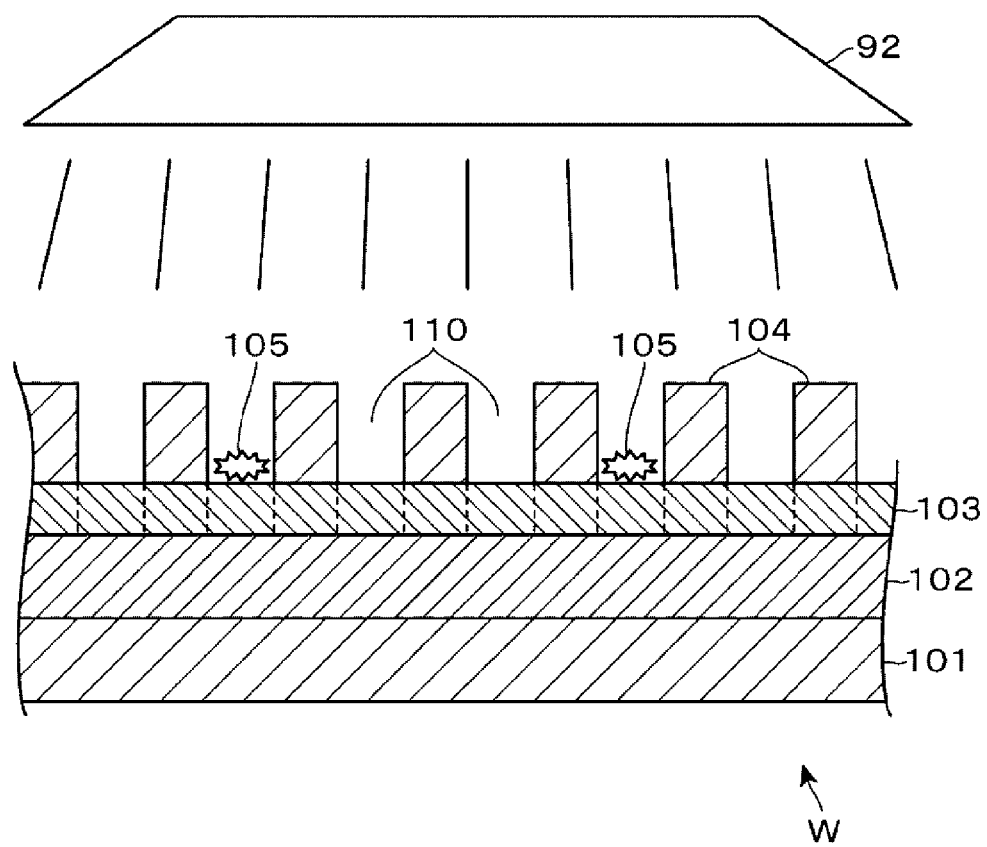
FIG. 16 is an explanatory view illustrating a mask pattern forming process according to a second embodiment of the present disclosure.

A method of forming a mask pattern according to a second embodiment of the present disclosure will be described. For example, the wafer W after the development process of the resist film 104 illustrated in FIG. 4 is performed is transferred to the UV irradiation module 9, in which the wafer W is irradiated with UV, as illustrated in FIG. 16. Furthermore, in this example, the anti-reflection film 103 is formed under the resist film 104 in order to improve the formation accuracy of the pattern of the resist film 104, but the resist film 104 may be formed on the SiO$_2$ film 102, excluding the anti-reflection film 103.

By irradiating the wafer W after the development process of the resist film 104 is performed with UV in this way, the resist film 104 is cross-linked to become the resist film 104A having high strength. At this time, the bonding of the metal components 105 remaining at the bottom of the recess pattern 110 to the film on the lower layer side is broken by irradiation with UV, whereby the metal components 105 becomes an excite state.

Figure 17:
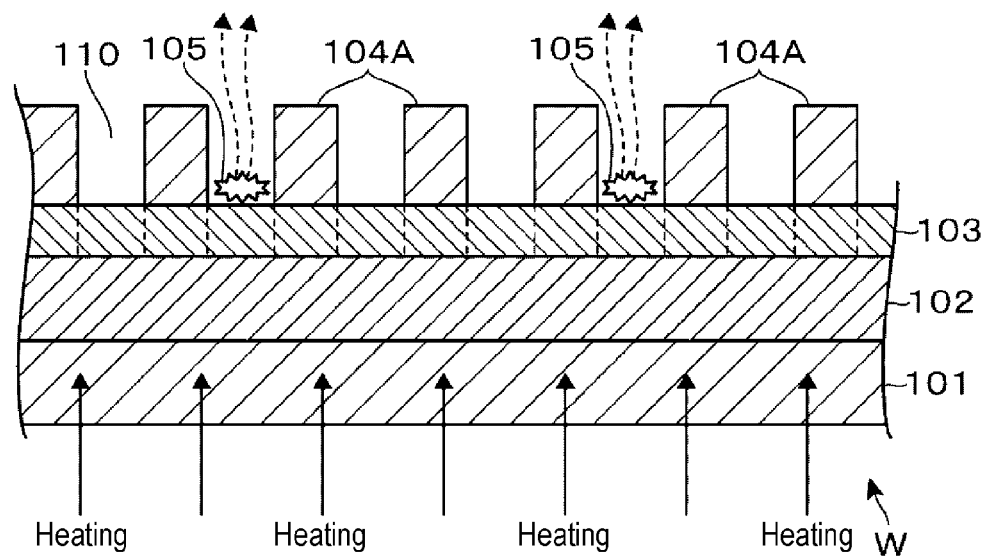
FIG. 17 is an explanatory view illustrating a mask pattern forming process according to the second embodiment.

Thereafter, the wafer W is transferred to the heating and cooling module 7 and heated at, e.g., 180 degrees C., for 180 seconds or more, e.g., 100 minutes, as illustrated in FIG. 17. Thus, the metal components 105 in an excited state on the bottom of the recess pattern 110 are sublimated and removed. As a result, since the metal components 105 can be allowed so as not to be adhered to the bottom of the pattern of the resist film 104, the same effects can be achieved.

At this time, when the metal components 105 is sublimated, the heating temperature of the wafer W is preferably 150 degrees C. or higher, and the wafer W is preferably heated for 180 seconds or more.

Figure 18:
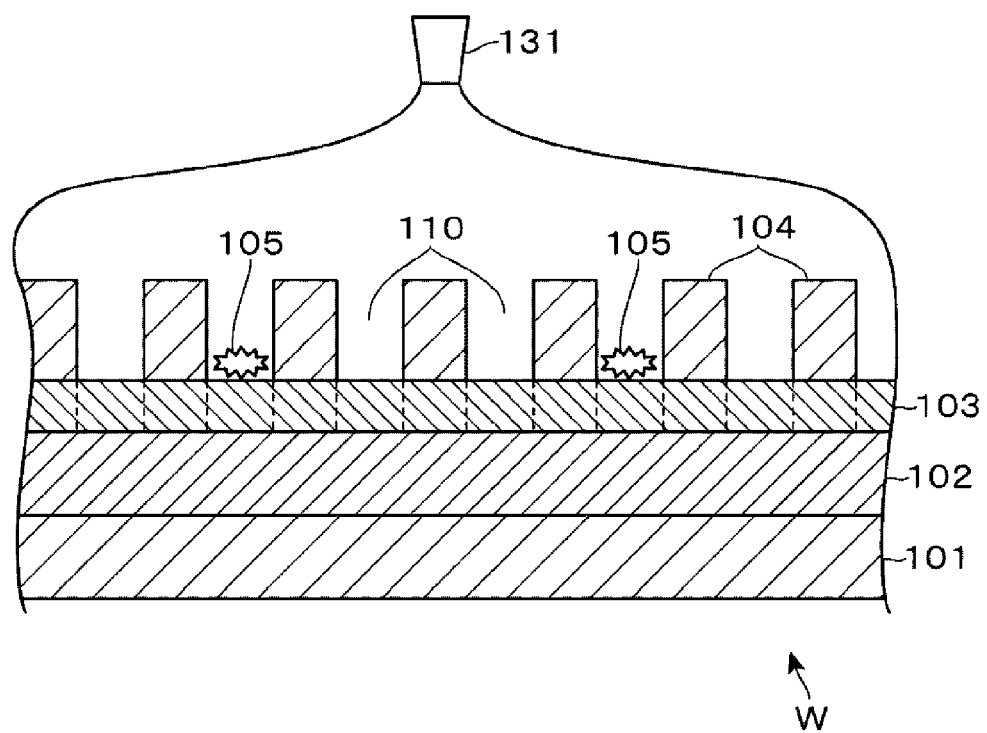
FIG. 18 is an explanatory view illustrating another example of the mask pattern forming process according to the second embodiment.

Furthermore, in the second embodiment, as illustrated in FIG. 16, after the resist film 104 is cross-linked by irradiation with UV, a chemical liquid capable of dissolving metal components, such as hydrochloric acid or the like, for example, an acid, may be supplied to the wafer W. For example, a liquid processing apparatus using hydrochloric acid as the processing liquid supplied to one substrate, may be used as the liquid processing apparatus in the substrate processing apparatus described in the second embodiment. Then, the wafer W after the resist film 104 is cross-linked by irradiation with UV, as illustrated in FIG. 16, may be transferred to the liquid processing apparatus, in which hydrochloric acid 130 may be supplied to the wafer W, as illustrated in FIG. 18. In addition, reference numeral 131 in FIG. 18 denotes a hydrochloric acid supply nozzle. At this time, since the pattern of the resist film 104 is cross-linked and has enhanced strength, the pattern can be kept without being dissolved in the hydrochloric acid 130. Furthermore, the metal components 105 remaining at the bottom of the recess pattern 110 can be dissolved and removed with the hydrochloric acid 130. Therefore, the metal components 105 does not remain at the bottom of the recess pattern 110, and the pattern damage of the resist film 104 can be further suppressed.

In addition, a configuration is possible, in which, after the resist film 104 is developed and removed in the development module 5, the metal components 105 are removed with a two-fluid rinse for cleaning the wafer W by supplying a gas and a cleaning liquid. Alternatively, the airflow on the surface of the wafer W may be controlled after the resist film 104 is developed and removed in the development module 5, and further, it may be configured so that while the surface of the wafer W is kept under a reduced humidity, rinsing with a cleaning liquid is performed on the wafer W by scanning the surface of the wafer W, thereby removing the metal components.

Moreover, after the resist film 104 is formed on the wafer W and before being transferred to the exposure station B4, the wafer W may be heated at, e.g., 300 degrees C. With this configuration, it is possible to shift the metal components 105 in the resist film 104 to an upper side of the resist film 104 or to volatilize the metal components 105 to remove them from the interior of the resist film 104. Therefore, when the exposure process and the development process of the metal-containing resist film are subsequently performed, it is possible to suppress the residual metal components at the bottom of the recess pattern 110.

Third Embodiment

Figure 19:
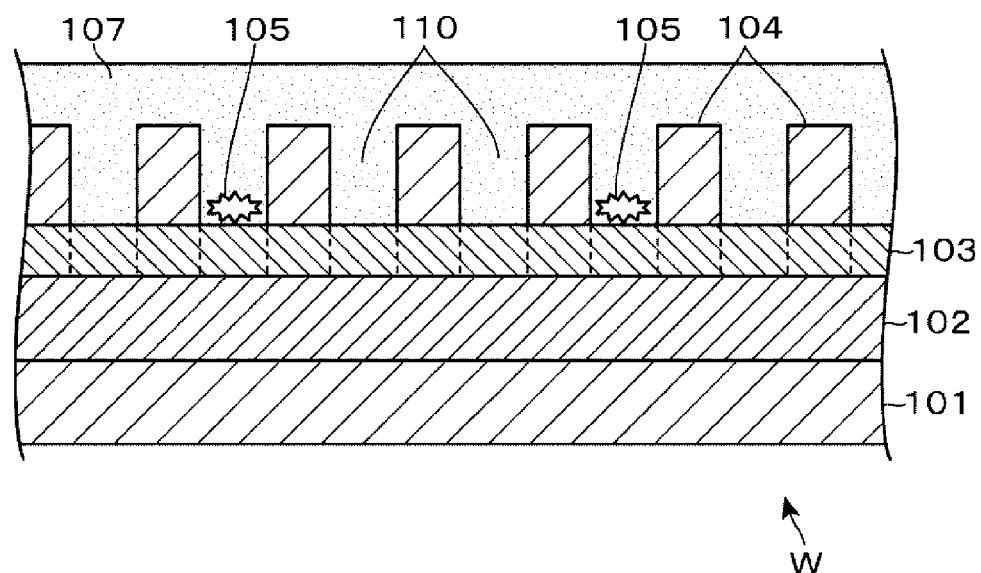
FIG. 19 is an explanatory view illustrating a mask pattern forming process according to a third embodiment of the present disclosure.
Figure 20:
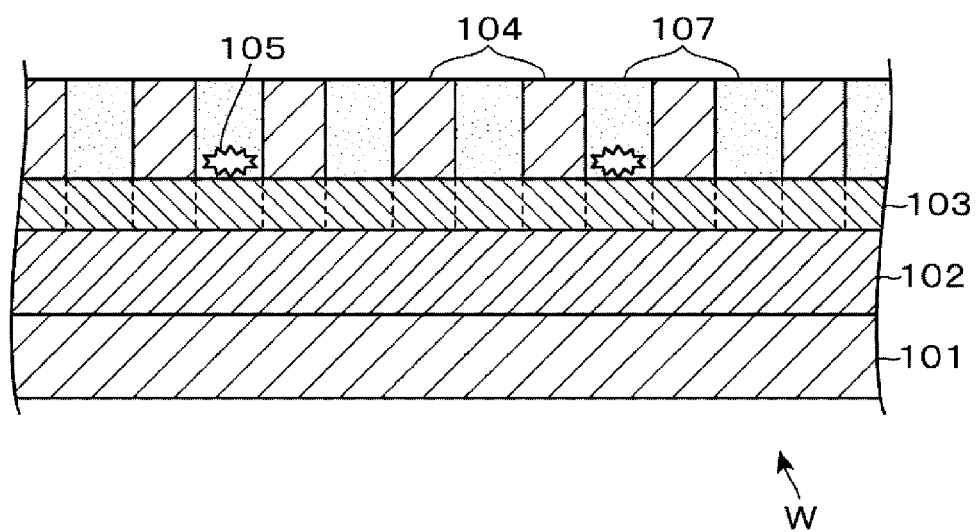
FIG. 20 is an explanatory view illustrating a mask pattern forming process according to the third embodiment.

Next, a method of forming a mask pattern according to a third embodiment of the present disclosure will be described. For example, after the exposure and development processes are performed on the pattern of the resist film 104 in the same manner as in the first embodiment, as illustrated in FIG. 19, a reversing agent 107 such as SiN or the like is then applied so as to fill the pattern of the resist film 104. Therefore, the metal components 105 remaining at the bottom of the recess pattern 110 of the resist film 104 are embedded in the reversing agent 107. Next, as illustrated in FIG. 20, its surface is polished by, for example, chemical mechanical polishing (CMP), to expose the resist film 104. For the CMP, for example, a known polishing device may be used. In the substrate processing apparatus illustrated in FIGS. 9 to 11, one of the heating and cooling modules 7 may be configured as the polishing device. Furthermore, in this example, a configuration in which a lower layer film, for example, the anti-reflection film 103, is formed under the resist film 104 is used, but a configuration in which the anti-reflection film 103 is removed and the resist film 104 is formed on the surface of the $SiO_2$ film may be used.

Figure 21:
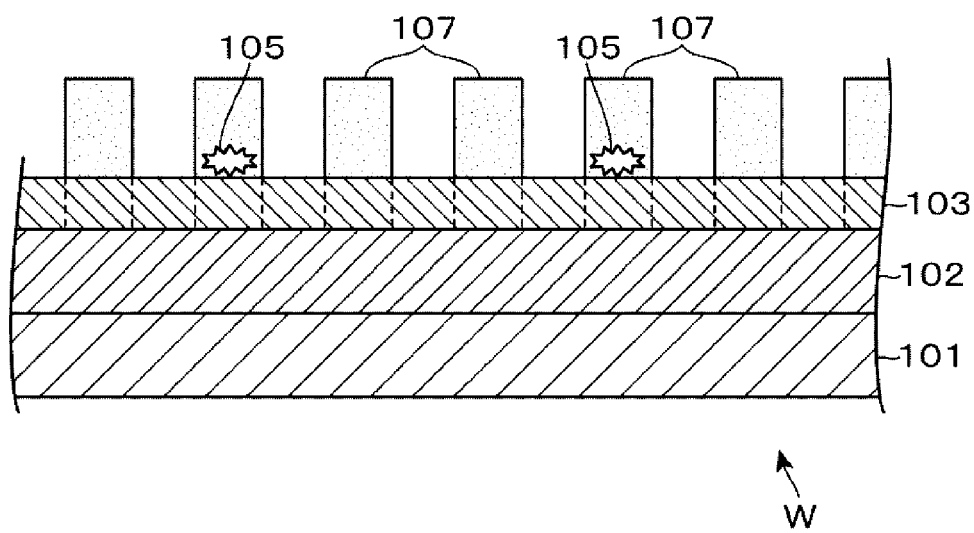
FIG. 21 is an explanatory view illustrating a mask pattern forming process according to the third embodiment.

In addition, the wafer W is transferred to an etching device, for example, a dry etching device using plasma, in which the resist film 104 is removed by etching as illustrated in FIG. 21. Therefore, the metal components 105 adhered to the bottom of the recess pattern 110 immediately after the development of the resist film 104 are embedded in the layer of the reversing agent 107 and are not exposed on its surface. Furthermore, at this time, the metal components can be removed so as not to be left on the surface of the anti-reflection film 103 by removing the resist film 104 by etching.

Figure 22:
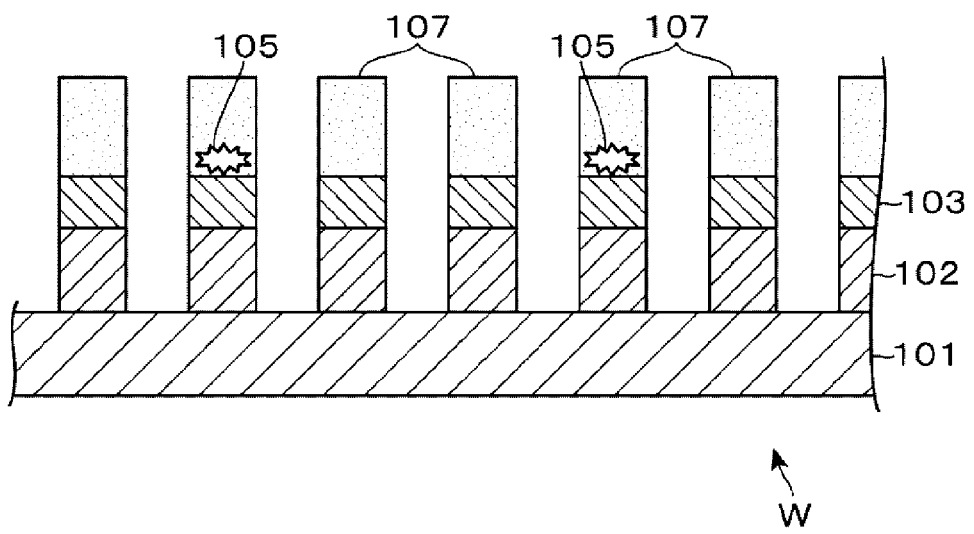
FIG. 22 is an explanatory view illustrating a mask pattern forming process according to the third embodiment.

Thereafter, the lower layer may be etched using the reversing agent 107 as a mask pattern as illustrated in FIG. 22. At this time, since the metal components 105 do not remain at the bottom of the pattern formed by the reversing agent 107, etching cannot be hindered, thereby suppressing occurrence of defects.

EXAMPLE

In order to verify the effects of the embodiments of the present disclosure, a mask pattern was formed by the method of forming a mask pattern according to the second embodiment, using the substrate processing apparatus described in the second embodiment. That is, the resist film 104 was cross-linked by irradiating a wafer W whose resist film 104 has been subjected to developing process with UV, and then the wafer W was heated at 180 degrees C. for 100 minutes. This test was repeated twice, whereby the remaining number of metal components 105 (the number of atoms/cm$^2$) adhered to the bottom of the recess pattern 110, was checked respectively in one minute and 100 minutes after start of heating of each wafer W.

Figure 23:
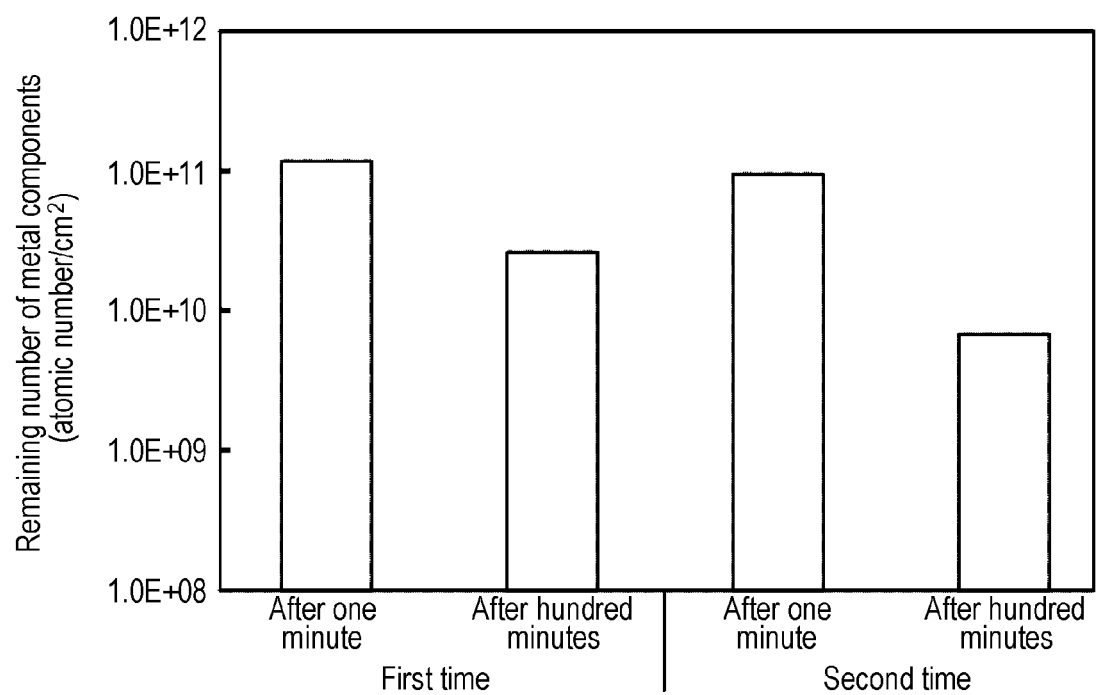
FIG. 23 is a characteristic diagram illustrating a remaining number of metal components in an example.

FIG. 23 shows the result, and is a characteristic diagram showing a remaining number (atomic number/cm$^2$) of the metal components 105 adhered to the bottom of the recess pattern 110 respectively in one minute and 100 minutes after the start of heating of the wafer W.

As illustrated in FIG. 23, in one minute after the start of heating, the metal components of about 1.0 E+11 (atomic number/cm$^2$) were confirmed, but the metal components were reduced by heating for 100 minutes, and reduced to 1.0 E+10 (atomic number/cm$^2$) or less. According to the result, it can be said that the metal components 105 remaining at the bottom of the recess pattern 110 can be reduced by developing the resist film 104 formed on the wafer W, irradiating UV, and then heating the wafer W. Thus, according to the present disclosure, it can be said that it is possible to reduce the remaining number of metal components 105, and to suppress defects in circuit patterns.

What is claimed is:

1. A method of forming a mask pattern on a surface of a substrate using a metal-containing resist, the method comprising:
forming a resist pattern by developing the substrate, wherein an under film is formed on the substrate, a resist film is formed on a surface of the under film, and then the substrate is exposed; and
removing at least a surface layer portion of the under film facing a bottom of the resist pattern to remove remaining metal components,
wherein the under film is not removed in the forming step,
wherein the under film has a property of being decomposed by irradiation with ultraviolet rays, and
wherein in the removing step, the at least a surface layer portion of the under film is removed by irradiating the substrate with ultraviolet rays.

2. The method of claim 1, wherein in the removing step, a chemical liquid having no dissolving action on the resist film and having dissolving action on the under film is supplied to the substrate.

3. The method of claim 2, wherein an exposed region of the resist film is not developed, and
the under film is an anti-reflection film whose exposed region is insoluble in the chemical liquid.

4. The method of claim 2, wherein an exposed region of the resist film is developed, and
the under film is an anti-reflection film whose exposed region is insoluble in the chemical liquid.

5. The method of claim 1, wherein the under film is an organic film containing carbon.

6. A method of forming a mask pattern on a surface of a substrate using a metal-containing resist, the method comprising:
forming a resist pattern by developing the substrate, wherein an under film is formed on the substrate, a resist film is formed on a surface of the under film, and then the substrate is exposed;
cross-linking the resist film by irradiating the surface of the substrate with ultraviolet rays; and
removing at least a surface layer of an under film facing a bottom of the resist pattern by heating the substrate, to remove remaining metal components,
wherein the under film is not developed.

7. A storage medium storing a computer program for use in a substrate processing apparatus for forming a mask pattern using a metal-containing resist on a surface of a substrate,
wherein the computer program is configured to have a group of steps to execute the method of claim 1.

8. A substrate processing apparatus, comprising:
a development module configured to form a resist pattern by developing a resist film of a substrate, wherein an under film is formed on the substrate, the resist film containing a metal is formed on a surface of the under film, and then the substrate is exposed; and
an under film removal module configured to remove at least a surface layer portion of the under film facing a bottom of the resist pattern to remove remaining metal components,
wherein the under film has a property of being decomposed by irradiation with ultraviolet rays, and
wherein the under film removal module is configured to remove the at least a surface layer portion of the under film by irradiating the substrate with ultraviolet rays.

9. The apparatus of claim 8, wherein the under film removal module is configured to supply a chemical liquid having no dissolving action on the resist film and having dissolving action on the under film to the substrate.

10. A substrate processing apparatus, comprising:
a development module configured to form a resist pattern by developing a resist film of a substrate, wherein an under film is formed on the substrate, the resist film containing a metal is formed on a surface of the under film, and then the substrate is exposed;
an ultraviolet irradiation module configured to irradiate a surface of the substrate after development with ultraviolet rays to cross-link the resist film; and
a heating module configured to heat the substrate after irradiation with the ultraviolet rays to remove at least a surface layer of an under film facing a bottom of the resist pattern to remove remaining metal components,
wherein the under film is not developed.

11. A method of forming a mask pattern on a surface of a substrate using a metal-containing resist, the method comprising:
forming a resist pattern by developing the substrate, wherein an under film is formed on the substrate, a resist film is formed on a surface of the under film, and then the substrate is exposed; and
processing at least a surface layer portion of the under film facing a bottom of the resist pattern to remove remaining metal components,
wherein the under film is not removed in the forming step.

12. The method of claim 11, wherein in the processing step, a chemical liquid having no dissolving action on the resist film and having dissolving action on the under film is supplied to the substrate.

13. The method of claim 12, wherein an exposed region of the resist film is not developed, and
the under film is an anti-reflection film whose exposed region is insoluble in the chemical liquid.

14. The method of claim 12, wherein an exposed region of the resist film is developed, and
the under film is an anti-reflection film whose exposed region is insoluble in the chemical liquid.

15. The method of claim 11, wherein the under film has a property of being decomposed by irradiation with ultraviolet rays, and
in the processing step, the at least a surface layer portion of the under film is removed by irradiating the substrate with ultraviolet rays.

16. The method of claim 15, wherein the under film is an organic film containing carbon.

17. The method of claim 11, wherein in the processing step, the surface layer portion of the under film facing the bottom of the resist pattern is heated.

18. The method of claim 11, wherein in the processing step, with a two-fluid rinse is supplied on the surface layer portion of the under film facing the bottom of the resist pattern.

19. A substrate processing apparatus, comprising:
a development module configured to form a resist pattern by developing a resist film of a substrate, wherein an under film is formed on the substrate, the resist film containing a metal is formed on a surface of the under film, and then the substrate is exposed; and
an under film processing module configured to process at least a surface layer portion of the under film facing a bottom of the resist pattern to remove remaining metal components.

* * * * *